United States Patent
Iseki

(10) Patent No.: US 8,845,828 B2
(45) Date of Patent: Sep. 30, 2014

(54) PB-FREE SOLDER ALLOY MAINLY CONTAINING ZN

(75) Inventor: Takashi Iseki, Tokyo (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 13/991,502

(22) PCT Filed: Oct. 20, 2011

(86) PCT No.: PCT/JP2011/074162
§ 371 (c)(1),
(2), (4) Date: Jun. 4, 2013

(87) PCT Pub. No.: WO2012/077415
PCT Pub. Date: Jun. 14, 2012

(65) Prior Publication Data
US 2013/0251587 A1    Sep. 26, 2013

(30) Foreign Application Priority Data
Dec. 8, 2010   (JP) ................................. 2010-274134

(51) Int. Cl.
*C22C 18/00* (2006.01)
*C22C 18/04* (2006.01)
*B23K 35/28* (2006.01)
*H05K 3/34* (2006.01)

(52) U.S. Cl.
CPC ............... *B23K 35/282* (2013.01); *C22C 18/04* (2013.01); *H05K 3/3463* (2013.01)
USPC .............................. 148/441; 420/514; 420/519

(58) Field of Classification Search
CPC ..... C22C 18/04; B23K 35/282; H05K 3/3463
USPC ................... 420/514, 519; 148/441
See application file for complete search history.

(56) References Cited

FOREIGN PATENT DOCUMENTS

| JP | H8-215880 | 8/1996 |
|----|-----------|--------|
| JP | H10-277732 | 10/1998 |
| JP | H11-77366 | 3/1999 |
| JP | 11-288955 | 10/1999 |
| JP | 2002-160089 A1 | 6/2002 |
| JP | 2004-358539 A1 | 12/2004 |
| JP | 2004-358540 | 12/2004 |
| JP | 2004-358540 A1 | 12/2004 |
| JP | 2006-167790 A1 | 6/2006 |
| JP | 3850135 B2 | 9/2006 |
| JP | 2007-209989 A1 | 8/2007 |

OTHER PUBLICATIONS

Mori et al., English machine translation of JP 2004-358540, Dec. 2004, p. 1-5.*
Shimizu et al., English machine translation of JP 11-288955, Oct. 1999, p. 1-5.*
International Search Report for International Application No. PCT/JP2011/074162 dated Jan. 17, 2012.
First Office Action issued Dec. 30, 2013 in counterpart application No. 201180059428.8 from The State Intellectual Property Office of The People's Republic of China with English translation.

* cited by examiner

*Primary Examiner* — Roy King
*Assistant Examiner* — Caitlin Kiechle
(74) *Attorney, Agent, or Firm* — Kratz, Quintos & Hanson, LLP

(57) ABSTRACT

There is provided a high-temperature Zn-based Pb free solder alloy having a melting point of approximately 300 to 400° C. and is excellent in wettability, joinability, workability and reliability.
The Pb-free solder alloy mainly containing Zn consists of: 1.0 to 9.0 mass %, preferably 3.0 to 7.0 mass % of Al, 0.002 to 0.800 mass %, preferably 0.005 to 0.500 mass % of P, and a balance being Zn except for inevitable impurities incorporated during a manufacturing stage. The Pb-free solder alloy may include at least one of 0.3 to 4.0 mass % of Mg or 0.3 to 3.0 mass % of Ge.

2 Claims, No Drawings

PB-FREE SOLDER ALLOY MAINLY CONTAINING ZN

TECHNICAL FIELD

The present invention relates to a Pb-free solder alloy containing no lead. More particularly, the present invention relates to a Pb-free solder alloy which mainly contains Zn and is suitable for high-temperature applications.

BACKGROUND ART

High-temperature soldering has been carried out for soldering various electronic parts in assembling processes such as a die-bonding of power transistor devices. For the high-temperature soldering, solder alloys having relatively high melting point of around 300 to 400° C. (hereinafter, also referred to as "high-temperature solder alloys") have been used. For the high-temperature solder alloys, a Pb-based solder alloy as represented by Pb-5 mass % Sn has been conventionally used.

Notwithstanding the above, restrictions on the use of Pb have become increasingly stringent these days due to concern about environmental pollution. For example, RoHS Directive has already designated Pb as a restricted substance. In response to this trend, there is a demand for providing a solder alloy containing no lead, i.e., a Pb-free solder alloy, in a technical field of assembling electronic parts and the like.

As for solder alloys for low- and medium-temperature service (about 140 to 230° C.), Pb-free solder alloys mainly containing Sn have already been practically used. For example, Patent Document 1 discloses a Pb-free solder alloy composition containing Sn as a major component, 1.0 to 4.0 mass % of Ag, 2.0 mass % or less of Cu, 0.5 mass % or less of Ni, and 0.2 mass % or less of P. Further, Patent Document 2 discloses a Pb-free solder alloy composition containing 0.5 to 3.5 mass % of Ag, 0.5 to 2.0 mass % of Cu, and the balance Sn.

On the other hand, as for the high-temperature solder alloys, in order to provide a Pb-free solder alloy, a Bi-based solder alloy and a Zn-based solder alloy have been developed by various organizations. For example, as for the Bi-based solder alloy, Patent Document 3 discloses a Bi/Ag brazing filler material containing 30 to 80 mass % of Bi and having a melting temperature of 350 to 500° C. Further, Patent Document 4 discloses a production method of an alloy by adding a binary eutectic alloy to an eutectic alloy containing Bi and by further adding an additive element thereto, which makes it possible to adjust liquidus-line temperature and to reduce variations in composition.

As for the Zn-based solder alloy, Patent Document 5 for example discloses a high-temperature Zn-based solder alloy which is formed by adding Ge or Mg to a base material of a Zn—Al alloy, in which Al is added to Zn in order to decrease its melting point. Patent Document 5 also discloses a technique of further adding Sn or In, which has an effect to further decrease the melting point.

Specifically, Patent Document 5 discloses the following Zn alloys: a Zn alloy composition containing 1 to 9 mass % of Al, 0.05 to 1 mass % of Ge, and the balance being Zn and inevitable impurities; a Zn alloy composition containing 5 to 9 mass % of Al, 0.01 to 0.5 mass % of Mg, and the balance being Zn and inevitable impurities; a Zn alloy composition containing 1 to 9 mass % of Al, 0.05 to 1 mass % of Ge, 0.01 to 0.5 mass % of Mg, and the balance being Zn and inevitable impurities; a Zn alloy composition containing 1 to 9 mass % of Al, 0.05 to 1 mass % of Ge, 0.1 to 25 mass % of Sn and/or In, and the balance being Zn and inevitable impurities; a Zn alloy composition containing 1 to 9 mass % of Al, 0.01 to 0.5 mass % of Mg, 0.1 to 25 mass % of Sn and/or In, and the balance being Zn and inevitable impurities; a Zn alloy composition containing 1 to 9 mass % of Al, 0.05 to 1 mass % of Ge, 0.01 to 0.5 mass % of Mg, 0.1 to 25 mass % of Sn and/or In, and the balance being Zn and inevitable impurities.

CITATION LIST

Patent Documents

Patent Document 1: Japanese Patent Application Kokai No. 11-077366
Patent Document 2: Japanese Patent Application Kokai No. 8-215880
Patent Document 3: Japanese Patent Application Kokai No. 2002-160089
Patent Document 4: Japanese Patent Application Kokai No. 2006-167790
Patent Document 5: Japanese Patent No. 3850135

DISCLOSURE OF THE INVENTION

Technical Problem

Because thermoplastic resins, thermosetting resins and the like are frequently used for material of construction of conventional electronic parts and substrates, it is preferable that a working temperature during their joining is less than 400° C., more preferably 370° C. or less. However, in the case of the Bi/Ag brazing filler material disclosed in Patent Document 3, its liquidus-line temperature is as high as 400 to 700° C., and therefore it is estimated that a working temperature during its joining becomes 400 to 700° C. or higher. In this case, the working temperature is considered to exceed the upper temperature limits of electronic parts or substrates to be joined. The method described in Patent Document 4 necessitates a quaternary or higher solder, that is, a multi-component solder in order to just adjust its liquidus-line temperature, and Patent Document 4 does not describe any effective measures against the brittle mechanical properties of a Bi, either.

Zn-based solder alloys with their compositions falling within the disclosed ranges in Patent Document 5 often exhibit poor wettability. This is because Zn as a main component is easily oxidized due to its strong reducing property, which causes a problem of extremely poor wettability. Further, Al has much more strong reducing property than Zn, and therefore addition of Al by, for example, 1 mass % or more significantly decreases the wettability. Addition of Ge or Sn cannot reduce these oxidized Zn and Al, and therefore Ge or Sn cannot improve the wettability.

As described above, although a Zn—Al-based alloy has a melting point of approximately 300 to 400° C. (Zn—Al eutectic temperature: 381° C.) which falls within a preferable range, this alloy is not preferable from the viewpoint of wettability. Further, addition of Mg and so on to the Zn—Al-based alloy forms an intermetallic compound, which hardens the Zn—Al-based alloy and may hinder good workability. For example, addition of Mg by 5 mass % or more to a Zn—Al-based alloy substantially makes it impossible to form the Zn—Al-based alloy into a hard-to-form shape such as a wire shape or a sheet shape.

As mentioned above, in the case of a high-temperature Pb-free solder alloy, in particular a Pb-free solder alloy mainly containing Zn, there is an unsolved big problem of improving the wettability in particular, while balancing various properties such as workability. In other words, a high-temperature solder alloy has actually not yet been found which can substitute for conventional Pb-based solder alloys as typified by a Pb-5 mass % Sn alloy.

The present invention has been made in view of the above circumstances, and an object of the present invention is to provide a high-temperature Pb-free and Zn-based solder alloy, i.e., a solder alloy containing no Pb and mainly containing Zn. This solder alloy has a melting point of approximately 300 to 400° C. which is suitable for use in assembling electronic parts or the like. This solder alloy is particularly excellent in wettability, as well as excellent in joinability, workability and reliability.

Solution to Problem

In order to achieve the above object, the present invention provides a Pb-free solder alloy mainly containing Zn, the solder alloy consisting of: 1.0 to 9.0 mass % of Al, 0.002 to 0.800 mass % of P, and a balance being Zn except for inevitable impurities incorporated during a manufacturing stage.

The Pb-free solder alloy mainly containing Zn of the present invention may include 3.0 to 7.0 mass % of Al, 0.005 to 0.500 mass % of P, and at least one of 0.3 to 4.0 mass % of Mg or 0.3 to 3.0 mass % of Ge. This solder alloy can have better wettability, joinability, and so on.

Advantageous Effects of Invention

According to the present invention, it is possible to provide a high-temperature Pb-free solder alloy which is particularly excellent in wettability, as well as excellent in joinability, workability, reliability and so on. The solder alloy also has a feature to sufficiently withstand a reflow temperature of approximately 300° C., which is suitable for use in soldering various electronic parts during assembling processes such as die-bonding of power transistor devices.

MODE FOR CARRYING OUT THE INVENTION

A Pb-free solder alloy mainly containing Zn according to the present invention does not include Pb but includes Al, P, and a balance being Zn except for inevitable impurities which are incorporated during a manufacturing stage. A melting point of Zn is 419° C. which is much higher than joining temperatures, i.e., 300 to 400° C., for joining electronic parts and the like. In addition, Zn has disadvantages in susceptibility to oxidation and in poor wettability due to its strong reducing property. To cope with these disadvantages of Zn, the present invention provides a technique to decrease the melting point until it reaches to a serviceable soldering temperature by adding Al. The addition of Al to Zn however degrades wettability of the Zn—Al alloy, but this can be significantly compensated for by an addition of P to the Zn—Al alloy.

It should be noted that the addition of Al can not only achieve a decreasing effect of the melting point to approximately 400° C. or lower by forming an eutectic alloy of Al and Zn but also improve workability by miniaturizing crystals. P has a strong reducing property than Zn and Al, and it carries away oxygen in the form of oxidized phosphate gases from a joining surface and a solder during joining. Because of this property, P is the most suitable element to improve the wettability. As a matter of course, P can also reduce and remove a surface oxide film provided over a Cu substrate or a Cu substrate with a Ni plating, and therefore wettability can be improved without using a forming gas when joining (the forming gas includes hydrogen so as not to promote oxidization of a substrate and the like).

By further adding at least one of Mg or Ge to the Pb-free solder alloy mainly containing Zn, it becomes possible to properly adjust a melting point, wettability, joining strength, reliability and so on in accordance with objectives. Hereinbelow, each of the elements added to the Zn-based solder alloy according to the present invention will be described in more detail.

<Al>

Al plays an important role and is an essential element to be added in the Pb-free solder alloy mainly including Zn according to the present invention. Al content is 1.0 mass % or more but 9.0 mass % or less. If the Al content is less than 1.0 mass %, an effect to decrease the melting point becomes insufficient and thus joinability is decreased even though other element is included. On the other hand, if the Al content exceeds 9.0 mass %, liquidus-line temperature of Zn-based solder alloy becomes too high, which leads to an insufficient melting of the alloy at an actual joining temperature to join electronic parts and the like. As a result, a void fraction may increase extremely and an insufficient alloying may occur around the joining section, making it impossible to provide practical joining.

It is preferable that Al content is 3.0 mass % or more but 7.0 mass % or less. This is because an alloy with this Al content comes closer to the eutectic composition of Zn—Al binary-based alloy, i.e., Zn=95 mass % and Al=5 mass %, which allows the alloy to have a decreased melting point and miniaturized crystals. Accordingly, workability of the alloy is improved and the alloy becomes much more serviceable.

<P>

Similarly to Al, P is an essential element to be added to the Pb-free solder alloy mainly including Zn according to the present invention. P has an effect on improving the wettability. The mechanism of improving the wettability by P can be described as follows. P has a strong reducing property, and therefore P suppresses oxidation of a surface of the solder alloy by P itself being oxidized. Particularly, in the present invention, Zn which is easily oxidized is mainly included in the solder alloy, and Al which is much more easily oxidized than Zn is also included in the solder alloy. Accordingly, addition of P plays an important role to improve wettability.

In addition, Addition of P has an effect to decrease the occurrence of voids during joining. Specifically, as described above, P itself is easily oxidized and therefore P is preferentially oxidized over main components of the solder alloy, i.e. Zn and Al, during joining. As a result, oxidation of the solder matrix is suppressed, and the joining surface of the electronic parts and the like is reduced to acquire wettability. Since oxidation products disappear from the solder and the joining surface during joining, voids formed by an oxide film are less likely to occur, thereby improving joinability, reliability and so on. It should be noted that upon reducing a substrate or the solder alloy including Zn, Al and so on, P becomes an oxidation product and vaporize. The vaporized P is then swept away by an environmental gas, and therefore there is no vaporized P left around the substrate and so on. For this reason, there is no chance that a residue of P adversely affects the reliability and so on. From this aspect also, it could be said that P is an excellent element.

It is preferable that P content is 0.002 mass % or more but 0.800 mass % or less. P has a very strong reducing property, and therefore P content of at least 0.002 mass % achieves an wettability-improving effect. On the other hand, the wettability-improving effect is not enhanced once the P content of the solder alloy exceeds 0.800 mass %. If P is excessively added, there is a possibility that large amount of gases consisting of P or an oxide of P build up in the joining portion of the solder, so that a void fraction is increased and P forms a brittle phase and segregates. This may embrittle the joining section and decrease reliability. In this regard, it has been confirmed that when a solder is processed into a wire or the like, the above-mentioned excessive addition of P is likely to cause a break. P content of 0.005 mass % or more but 0.500 mass % or less is much more preferable, because it exerts a reducing effect and does not produce a brittle compound of P.

<Mg>

Mg is an element appropriately added upon request to adjust several properties of the Pb-free solder alloy mainly including Zn according to the present invention. Addition of Mg has the following effects. Mg forms eutectic alloys with Zn at two compositions and their eutectic temperatures are 341° C. and 364° C., respectively. Because these two eutectic temperatures are lower than that of the Zn—Al alloy, Mg is added when the melting point of the alloy needs to be further decreased.

Further, because Mg is more easily oxidized than Zn and Al, small amount of Mg content has an effect to improve wettability. However, Mg content requires attention because large amount of Mg content forms a strong oxide film over a solder surface. In consideration of the above described melting-point-decreasing effect and the wettability-improving effect, although the joining conditions vary case by case, Mg content of 0.3 mass % or more but 4.0 mass % or less is preferable. If the Mg content is less than 0.3 mass %, it is too small and it cannot sufficiently exert the effects of Mg. On the other hand, if the Mg content exceeds 4.0 mass %, problems occur such as deterioration of wettability and an excessive increase of liquidus-line temperature.

<Ge>

Similarly to Mg, Ge is an element appropriately added upon request to adjust several properties of the Pb-free solder alloy mainly including Zn according to the present invention. Ge also forms an eutectic alloy with Zn. Ge is superior to Mg in that Zn—Ge alloy does not form an intermetallic compound and therefore it is excellent in workability, whereas Zn—Mg forms an intermetallic compound. An eutectic temperature of Zn—Ge binary-based alloy is 394° C., which is inferior to Mg though, but Ge has a sufficient effect to decrease the melting point.

It is preferable that Ge content is 0.3 mass % or more but 3.0 mass % or less. If the Ge content is less than 0.3 massa, it is too small and sufficient effect of Ge cannot be obtained. On the other hand, an effect of addition of Ge remains unchanged once Ge content exceeds 3.0 mass %. Accordingly, the present inventor have specified the upper limit of Ge at 3.0 mass % because Ge is expensive and a solder material containing Ge of more than 3.0 mass % makes a solder alloy too expensive and not practical.

EXAMPLES

As raw materials, Zn, Al, P, Mg and Ge each having a purity of 99.9 mass % or higher were prepared. When the raw materials were in a large slice form or bulk form, they were cut and pulverized into pieces having sizes of 3 mm or less while attention was paid so that the composition of an alloy after melting would become uniform, that is, would not vary depending on sampling site. Then, predetermined amounts of these raw materials were weighed and placed in a graphite crucible for a high-frequency melting furnace.

The crucible containing the raw materials was placed in the high-frequency melting furnace, and nitrogen was introduced to flow through the melting furnace at a flow rate of 0.7 L/min or higher per kilogram of the raw materials to suppress oxidation. In such a state, the melting furnace was turned on to heat up and melt the raw materials. When started to be melted, the metals were sufficiently stirred with a mixing bar and uniformly mixed to avoid localized variations in composition. After it was confirmed that the metals had been sufficiently melted, a high-frequency power source was turned off, and the crucible was rapidly taken out of the melting furnace, and molten metal contained in the crucible was poured into a mold of a master solder alloy. The mold had the same shape as that usually used for manufacturing of solder alloys.

In this way, Samples 1 to 19 of Zn-based master solder alloys different in the mixing ratio among the raw materials were prepared. The solidus-line temperature of each of the master solder alloys of Samples 1 to 19 was determined. In addition, the composition of each of the master solder alloys of Samples 1 to 19 was analyzed by an ICP emission spectrometer (SHIMADZU S-8100). The results of the analysis and the solidus-line temperatures are shown in the following Table 1.

TABLE 1

| Samples | Solder Composition (mass %) | | | | | Solidus-line Temperature (° C.) |
| --- | --- | --- | --- | --- | --- | --- |
| | Zn | Al | P | Mg | Ge | |
| 1 | Balance | 1.1 | 0.107 | — | — | 388 |
| 2 | Balance | 4.3 | 0.102 | — | — | 380 |
| 3 | Balance | 8.8 | 0.104 | — | — | 382 |
| 4 | Balance | 3.2 | 0.005 | — | — | 381 |
| 5 | Balance | 3.3 | 0.265 | — | — | 380 |
| 6 | Balance | 3.1 | 0.491 | — | — | 379 |
| 7 | Balance | 3.1 | 0.101 | 0.4 | — | 294 |
| 8 | Balance | 3.2 | 0.104 | 2.1 | — | 293 |
| 9 | Balance | 3.3 | 0.108 | 3.8 | — | 292 |
| 10 | Balance | 3.4 | 0.110 | — | 0.4 | 364 |
| 11 | Balance | 3.2 | 0.104 | — | 1.6 | 362 |
| 12 | Balance | 3.1 | 0.102 | — | 2.8 | 361 |
| 13 | Balance | 3.2 | 0.109 | 0.3 | 1.2 | 302 |
| *14 | Balance | 0.3 | 0.102 | — | — | 410 |
| *15 | Balance | 12.5 | 0.103 | — | — | 378 |
| *16 | Balance | 3.3 | 1.325 | — | — | 380 |
| *17 | Balance | 3.1 | 0.105 | 6.5 | — | 285 |
| *18 | Balance | 3.1 | 0.106 | — | 5.2 | 362 |
| *19 | Balance | 3.2 | 0.101 | 0.1 | 0.1 | 312 |

Note:
Samples marked with * are Comparative Examples.

Then, each of the master solder alloys of Samples 1 to 19 was formed into a sheet shape by a rolling mill as described below. In this manner, workability of the Pb free solder alloys mainly containing Zn were evaluated. Further, with respect to each of the sheet shaped solder alloys, evaluation of wettability (joinability) and evaluation of reliability by way of heat cycle test were carried out as described below. It is to be noted that the evaluations of a solder such as wettability and joinability do not depend on the shape of the solder, and therefore the solder to be evaluated may be formed into any shape such as a wire, ball, or paste. However, in this example, each Sample was evaluated in the form of a sheet.

<Evaluation of Workability>

Each of the master solder alloys of Samples 1 to 19 (plate shaped ingot with 5 mm thickness) shown in the above Table 1 was rolled by the rolling mill to have a thickness of 0.08 mm. In each of the rolling processes, a feed speed of the ingot was adjusted, and then a rolled product was cut to have a 25 mm width by way of a slitter processing. Each of the sheet-shaped Zn-based solder alloys obtained by the abovementioned method was observed. Evaluation was performed according to the following criteria.

good: No scarring nor cracking was observed.

average: One to three breakings or cracks were observed per 10 m length of the sheet.

poor: Four or more breakings or cracks were observed per 10 m length of the sheet.

<Evaluation of Wettability (Joinability)>

Each of the sheet-shaped solder alloys obtained by the above described method was evaluated by using a wettability tester (device name: atmosphere control-type wettability tester). Specifically, a heater unit of the wettability tester was doubly covered, and nitrogen was introduced to flow from four points around the heater unit so that a flow rate of nitrogen at each point becomes 12 L/min. Then, the heater unit was heated up to a temperature of approximately 10° C. higher than each melting point of the Samples. After the temperature of the heater became stable, a Cu substrate (thickness: approximately 0.70 mm) was set in the heater unit and heated for 25 seconds.

Then, each of the solder alloy Samples was placed on the Cu substrate and heated for 25 seconds. After the completion of heating, the Cu substrate was removed from the heater unit, and was once moved to a place besides the heater unit for cooling where a nitrogen atmosphere was maintained. After being sufficiently cooled, the Cu substrate was exposed to the atmosphere to observe a joint part. The joint part between each of the solder alloy Samples and the Cu substrate was visually inspected in order to evaluate the wettability according to the following criteria.

poor: Joining was not successful.

average: Joining was successful but spreading of the solder was poor (the solder was not spread).

good: Joining was successful and good spreading of the solder was achieved (the solder thinly spread).

<Heat Cycle Test>

A heat cycle test was carried out in order to evaluate a reliability of a solder joint. This test was performed by using the solder alloy Samples which were evaluated as successful, i.e., good and average, in the above described wettability evaluation. Specifically, in each of these successful Samples, two solder alloys were respectively joined to the two Cu substrates in a manner similar to the above described wettability evaluation, and then one of them was repeatedly subjected to cooling and heating cycles up to 300 cycles in order to evaluate a condition at an intermediate stage, where each cycle consists of cooling at −40° C. and heating at 150° C. On the other hand, the other was repeatedly subjected to the similar cooling and heating cycles up to 500 cycles.

After completion of these 300 and 500 cooling and heating cycles, each Cu substrate with the solder alloy was embedded in a resin, and the cross section of the resin was polished to observe a joint surface by SEM (HITACHI S-4800). Evaluation was performed according to the following criteria.

poor: Separation of the joint surface or cracking of the solder was observed.

good: Such defects were not observed and the joint surface remained in its initial state.

The results of the above-described evaluations and tests are shown in Table 2.

TABLE 2

| Samples | Formability | Wettability | Heat Cycle Test (cycles) 300 | 500 |
|---|---|---|---|---|
| 1 | good | good | good | good |
| 2 | good | good | good | good |
| 3 | good | good | good | good |
| 4 | good | good | good | good |
| 5 | good | good | good | good |
| 6 | good | good | good | good |
| 7 | good | good | good | good |
| 8 | good | good | good | good |
| 9 | good | good | good | good |
| 10 | good | good | good | good |
| 11 | good | good | good | good |
| 12 | good | good | good | good |
| 13 | good | good | good | good |
| *14 | poor | good | poor | — |
| *15 | poor | poor | — | — |
| *16 | average | good | poor | — |
| *17 | poor | average | poor | — |
| *18 | poor | average | poor | — |
| *19 | average | good | good | poor |

Note:
Samples marked with * are Comparative Examples.

As can be seen from Tables 1 and 2, the solder alloys of Samples 1 to 13 achieved good results for all the evaluation items. Specifically, the Samples 1 to 13 were able to be formed into sheet-shapes without having scarring or cracking, and were good at wettability and reliability. It is considered that good wettability was caused by addition of P to a Zn—Al alloy, which suppressed formation of an oxide film inhibiting wettability. As a result, these solder alloys thinly spread over the Cu substrate at the moment they came into contact with the Cu substrate. Further, as for the Samples 1 to 13, defects such as breaking were not observed even after 500 cooling and heating cycles, and therefore the Samples 1 to 13 achieved good joinability and reliability.

On the other hand, the solder alloy Samples 14 to 19 resulted in poor results for at least any one of the evaluation items because content of Al or P was inappropriate, or content of Mg or Ge was inappropriate. Specifically, during the workability evaluation, scarring or cracking occurred in all of the Samples 14 to 19, and half of the Samples 14 to 19 were poor in wettability. In the heat cycle test, defects were observed in all the Samples other than Sample 19 before 300 cycles (except for Sample 15 in which joining was not successful). As for Sample 19, defects were observed before 500 cycles.

The invention claimed is:

1. A Pb-free solder alloy mainly containing Zn, consisting of: 1.0 to 9.0 mass % of Al, 0.002 to 0.800 mass % of P, between greater than 1 mass % and less than 2 mass % of Ge, and a balance being Zn except for inevitable impurities incorporated during a manufacturing stage.

2. A Pb-free solder alloy mainly containing Zn consisting of: 3.0 to 7.0 mass % of Al, 0.005 to 0.500 mass % of P, and at least one of between greater than 0.5 mass % and 4.0 mass % of Mg or between greater than 1 mass % and less than 2 mass % of Ge, and a balance being Zn except for inevitable impurities incorporated during a manufacturing stage.

* * * * *